United States Patent
Ikeda

(10) Patent No.: US 8,022,753 B2
(45) Date of Patent: Sep. 20, 2011

(54) SEMICONDUCTOR INTEGRATED CIRCUIT WITH INTERMITTENT POWER SUPPLY OPERATION OF CIRCUIT BLOCKS

(75) Inventor: Motohisa Ikeda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/688,499

(22) Filed: Jan. 15, 2010

(65) Prior Publication Data

US 2010/0117714 A1 May 13, 2010

Related U.S. Application Data

(63) Continuation of application No. PCT/JP2007/065640, filed on Aug. 9, 2007.

(51) Int. Cl.
*G05F 1/10* (2006.01)
(52) U.S. Cl. ...................................................... 327/544
(58) Field of Classification Search .................. 327/534, 327/535, 540, 543, 544
See application file for complete search history.

(56) References Cited

U.S. PATENT DOCUMENTS

| | | | | |
|---|---|---|---|---|
| 5,646,900 A | * | 7/1997 | Tsukude et al. | 365/205 |
| 6,049,245 A | * | 4/2000 | Son et al. | 327/544 |
| 6,570,439 B2 | * | 5/2003 | Berthold | 327/544 |
| 7,895,453 B2 | * | 2/2011 | Kasahara et al. | 713/300 |
| 2006/0095829 A1 | | 5/2006 | Muranushi et al. | |
| 2006/0259800 A1 | | 11/2006 | Maejima | |
| 2007/0255929 A1 | | 11/2007 | Kasahara et al. | |

FOREIGN PATENT DOCUMENTS

| | | |
|---|---|---|
| JP | 63175909 | 7/1988 |
| JP | 05108850 | 4/1993 |
| JP | 2003114742 | 4/2003 |
| JP | 2006127152 | 5/2006 |
| WO | 2006109887 A1 | 10/2006 |

OTHER PUBLICATIONS

International Search Report dated Oct. 9, 2007 International application No. PCT/JP2007/065640.
Extended European Search Report dated Dec. 23, 2010, issued in corresponding European patent application No. 07792290.4-1233/2178115.

* cited by examiner

*Primary Examiner* — Jeffrey Zweizig
(74) *Attorney, Agent, or Firm* — Murphy & King, P.C.

(57) ABSTRACT

A semiconductor integrated circuit that carries out intermittent operation, includes a processor block; an logical operation block other than a processor; a first switch part configured to supply a normal operation voltage to the logical operation block other than a processor; a second switch part configured to supply the normal operation voltage to the processor block; a third switch part configured to supply a data holding voltage lower than the normal operation voltage to the processor block; and a fourth switch part configured to be turned on, when the second switch means is turned off and the third switch means is turned on, and supply the data holding voltage to the processor block.

13 Claims, 13 Drawing Sheets

FIG.3

| BLOCK | | ACTIVE | STANDBY | RETENTION | OFF | RESET |
|---|---|---|---|---|---|---|
| OTHER THAN PROCESSOR | LOGIC | 100 | 2 | 0.5 | 0.0 | 100 |
| OTHER THAN PROCESSOR | RAM | 100 | 2 | 0.5 | 0.0 | 100 |
| PROCESSOR | LOGIC | 15 | 2 | 0.5 | 0.0 | 15 |
| PROCESSOR | RAM | 15 | 2 | 0.5 | 0.0 | 15 |

FIG.4

| CASE | ACTIVE | STANDBY/RETENTION/OFF | RESET |
|---|---|---|---|
| RATIO OF NON-OPERATING/OPERATING IS SMALL (WITHOUT RESET) | 1.0% | 99.0% | 0.0% |
| RATIO OF NON-OPERATING/OPERATING IS SMALL (WITH RESET) | 1.0% | 95.0% | 4.0% |
| RATIO OF NON-OPERATING/OPERATING IS LARGE (WITHOUT RESET) | 0.1% | 99.9% | 0.0% |
| RATIO OF NON-OPERATING/OPERATING IS LARGE (WITH RESET) | 0.1% | 99.5% | 0.4% |

FIG.5

| | RATIO OF NON-OPERATING STATE | TOTAL CURRENT | AVE. | RATIO OF RELATED ART/ EXAMPLE OF INVENTION |
|---|---|---|---|---|
| RELATED ART | RATIO OF NON-OPERATING STATE IS SMALL (WITHOUT RESET) | 4.78 | 2.52 | 1.5 TIMES |
| | RATIO OF NON-OPERATING STATE IS LARGE (WITHOUT RESET) | 0.27 | | |
| RELATED ART | RATIO OF NON-OPERATING STATE IS SMALL (WITH RESET) | 11.50 | 5.81 | 3.4 TIMES |
| | RATIO OF NON-OPERATING STATE IS LARGE (WITH RESET) | 0.12 | | |
| EXAMPLE OF INVENTION | RATIO OF NON-OPERATING STATE IS SMALL (WITHOUT RESET) | 3.29 | 1.17 | — |
| | RATIO OF NON-OPERATING STATE IS LARGE (WITH RESET) | 0.12 | | | ial circuit.

SEMICONDUCTOR INTEGRATED CIRCUIT WITH INTERMITTENT POWER SUPPLY OPERATION OF CIRCUIT BLOCKS

CROSS-REFERENCE TO RELATED APPLICATIONS

This application is a U.S. continuation application filed under 35 USC 111(a) claiming benefit under 35 USC 120 and 365(c) of PCT application JP2007/065640, Aug. 9, 2007. The foregoing applications are hereby incorporated herein by reference.

FIELD

The embodiments discussed herein relate to a semiconductor integrated circuit, and to a semiconductor integrated circuit that has a processor block and a logical operation block other than a processor, and carries out an intermittent operation.

BACKGROUND

Japanese Laid-Open Patent Publication No. 2003-114742 discusses providing processors in a plurality of functional circuit blocks so that they can operate independently, providing a system state transition resistor and a power-off register, controlling the registers by an external computer, and controlling power-off separately for the functional circuit blocks that are in an operation stop state.

SUMMARY

According to one aspect of the embodiments, a semiconductor integrated circuit that carries out intermittent operation, includes a processor block; an logical operation block other than a processor; a first switch part configured to supply a normal operation voltage to the logical operation block other than a processor; a second switch part configured to supply the normal operation voltage to the processor block; a third switch part configured to supply a data holding voltage lower than the normal operation voltage to the processor block; and a fourth switch part configured to be turned on, when the second switch means is turned off and the third switch means is turned on, and supply the data holding voltage to the processor block.

The object and advantages of the invention will be realized and attained by means of the elements and combinations particularly pointed out in the claims.

It is to be understood that both the foregoing general description and the following detailed description are exemplary and explanatory only and are not restrictive of the invention, as claimed.

BRIEF DESCRIPTION OF DRAWINGS

FIG. 3 is a diagram depicting a ratio of a consumed current of each circuit.

FIG. 4 is a diagram depicting a ratio of a time of non-operating/operating.

FIG. 5 is a diagram depicting a ratio of a total consumed current.

DESCRIPTION OF EMBODIMENTS

For a system LSI (Large Scale Integrated circuit) for a portable information terminal such as a cellular phone, a global clock gating technique, and a power gating technique are provided as a technology for achieving long time driving by using a battery.

The global clock gating technique is such that, in a non-operating time of an intermittent operation (stand-by operation), distribution clock signals to unnecessary blocks are stopped so that an operating current is reduced to a leak level.

The power gating technique is such that, further a power supply line to each block is previously separated, and a switch for each power supply line provided outside of a semiconductor chip or inside of the semiconductor chip is turned off, so that a leak current of the block is also reduced.

For the future, to save power consumption by using on-chip power gating technique becomes a main current in view of a miniaturization of transistors along with technology improvement, an increase in a leak current which becomes unignorable because of an increase in circuit size that is mounted, and a power-off switching speed.

It is noted that Patent Document 1 describes providing processors in a plurality of functional circuit blocks so that they can operate independently, providing a system state transition resistor and a power-off register, controlling the registers by an external computer, and controlling power-off separately for the functional circuit blocks that are in an operation stop state.

Patent Document 1: Japanese Laid-Open Patent Publication No. 2003-114742

When a power supply is turned off during an intermittent operation (stand-by operation), a situation in a recovering operation is very different between a processor that operates by firmware and another processing circuit. In a case where a power supply to a processor is turned off, a problem occurs in recovering to a normal operating (transmitting/receiving operation). When a consideration is not carried out upon turning off a power supply, a time is required in recovery because, the same as an initialization operation, a firmware is read from an external memory, and a reset operation for starting up the firmware in sequence is required.

As a result, a time for which a power supply is turned off is reduced. Further, a method may be considered in which, before turning off, the contents of a memory or flip-flops of a processor is saved in a RAM or such outside of an LSI, and, in recovery, the contents are read from the RAM or such outside of the LSI in the memory or the flip-flops reversely. However, a firmware should be developed for achieving complicate operations.

Figure 1:
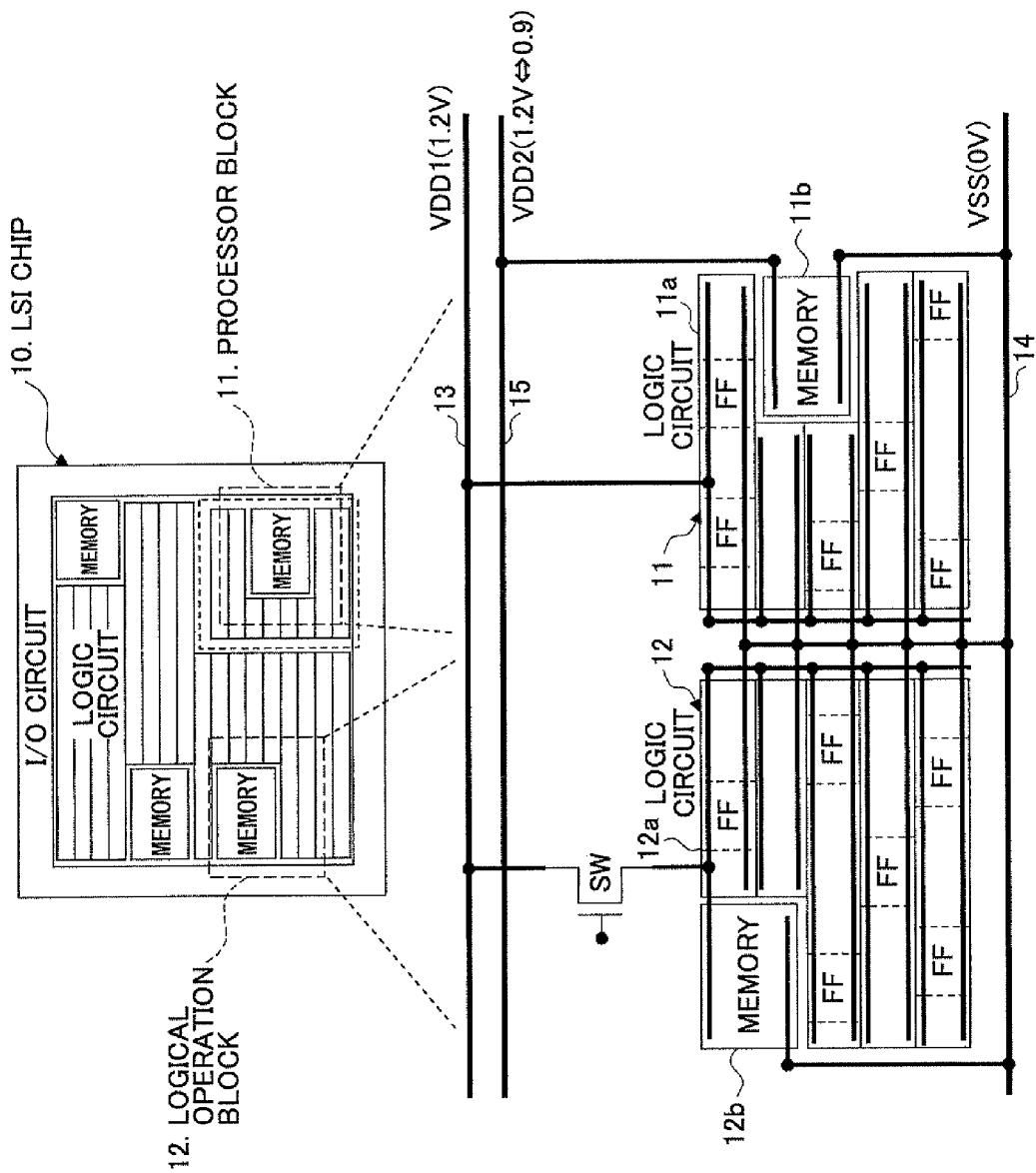
FIG. 1 is a configuration diagram of one example of a related-art semiconductor integrated circuit.

FIG. 1 depicts one example of a configuration diagram of a related-art semiconductor integrated circuit for solving this. In the same figure, in a LSI chip 10, a processor block 11 and a logical operation block 12 other than the processor block 11 are provided.

The processor block 11 includes a logic circuit part 11a and a memory 11b, power VDD (1.2 V) and VSS are constantly supplied to the logic circuit part 11a from global power supply wires 13 and 14, and power VDD (1.2 V/0.9 V) and VSS are constantly supplied to the memory 11b from global power supply wires 14 and 15.

The logical operation block 12 includes a logic circuit part 12a and a memory 12b, and power VDD (1.2 V) and VSS are constantly supplied to the logic circuit part 12a and the memory 12b only when a MOS transistor SW is turned on.

That is, such a method has been a main current that, the power VDD is separated for the processor block 11 and the logical operation block 12 other than the processor block 11, the power VDD for the logical operation block 12 is not turned off during an intermittent operation, a retention is carried out only for the memory 11b such that the power VDD is reduced from 1.2 V to 0.9 V that is a lowest voltage for being able to hold data, and thus, an electric current is reduced.

Ordinarily, there is a tendency that the processor block 11 is required to have the highest processing speed in a chip, also the logic circuit uses high-speed transistors that have larger leak currents, and, when a time of turning off is long, a leak current reducing effect decreases in the LSI chip 10 in total. It is noted that high-speed transistors have short gate lengths, and thus, have large leak currents.

As a countermeasure, in order to control a leak current of the logic circuit part 11a in the processor block 11 as much as possible, a scheme may be considered such that a power source is separated for storage circuits such as flip-flops, and other gate logic circuits, and a power supply only the logic gate circuits is selectively turned off. However, in an actual layout, flip-flops are, functionally, disposed in a scattered manner, and thus, it is difficult to physically carry out power supply separation. If power supply separation is carried out nevertheless, problematically an area increases.

Further, another scheme may be considered such that data in flip-flops is saved in other built-in flip-flops provided for the purpose holding the data. However, problematically, a complication occurs in a recovery operation and an area increases.

The present invention has been devised in consideration of the above-mentioned points, and a general object of the present invention is to reduce a leak current, and provide a semiconductor integrated circuit that achieves a plurality of recovering modes, without a remarkable increase in an area.

In order to achieve the object, a semiconductor integrated circuit according to the present invention has, in a semiconductor integrated circuit having a processor block and an logical operation block other than a processor, and carrying out an intermittent operation, first switch means for supplying a normal operation voltage to the logical operation block other than a processor; second switch means for supplying the normal operation voltage to the processor block; third switch means for supplying a data holding voltage lower than the normal operation voltage to the processor block; and fourth switch means for being turned on, when the second switch means is turned off and the third switch means is turned on, and supplying the data holding voltage to the processor block.

By the semiconductor integrated circuit, it is possible to reduce a leak current, and to achieve a plurality of recovering modes without remarkably increasing an area.

Below, based on figures, embodiments of the present invention will be described.

First Embodiment

Figure 2:
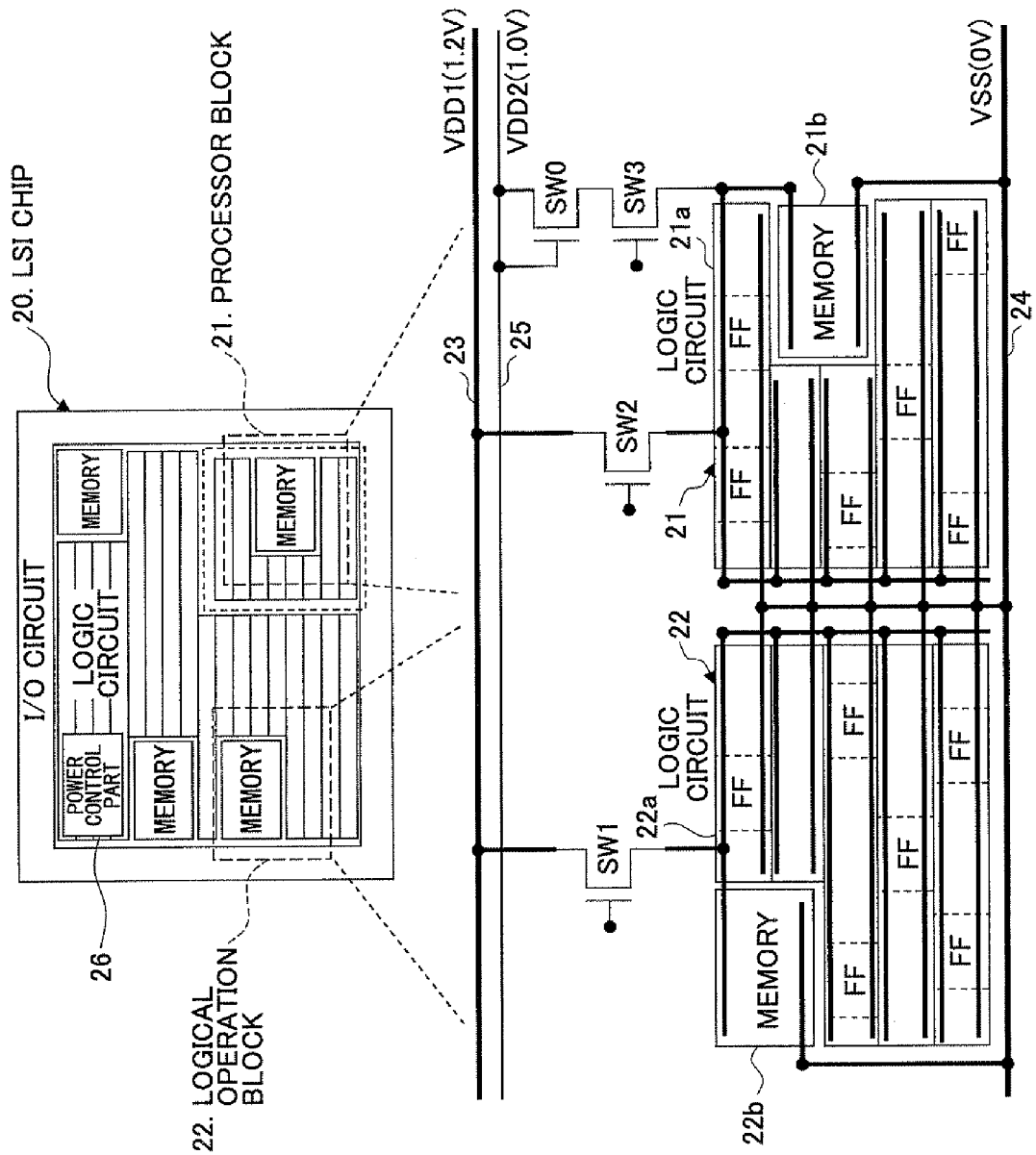
FIG. 2 is a configuration diagram of a first embodiment of a semiconductor integrated circuit according to the present invention.

FIG. 2 depicts a configuration diagram of a first embodiment of a semiconductor integrated circuit according to the present invention. In the figure, in a LSI chip 20 that is a system LSI for a portable information terminal for example, a processor block 21 and a logical operation block 22 other than a processor are provided. Further, in the LSI chip 20, a power control part 26 is provided.

The processor block 21 has a logic circuit part 21a and a memory 21b, and the logical operation block 22 has a logic circuit part 22b and a memory 22b.

A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and a global power supply wire 25 supplies a power VDD2 of a voltage that is slightly higher than the lower limit voltage (for example, 0.9 V) by which voltage the logical circuit parts and the memories in the LSI chip 20 can carry out a holding operation, for example, 1.0 V.

N-channel MOS transistors SW1 through SW3 are transistors that are turned on when a voltage higher than the power VDD1, for example, 3.3 V, is applied to gates, respectively. Therefore, it is possible to reduce leak currents occurring when a voltage of 0 V is applied to SW1 through SW3 that are then turned off, in comparison to ordinary transistors that are turned on by a gate voltage of 1.2 V. Switching of turning on/off of SW1 through SW3 is controlled by the power control part 26.

The power VDD2 is applied to a gate and a drain of the n-channel MOS transistor SW0, which is turned on when a voltage $V_{GS}$ between the gate and a source exceeds a threshold voltage $V_{TH}$ (for example, 0.1 V).

When being turned on, the MOS transistor SW1 supplies from the global power supply wire 23 the power VDD1 to the logic circuit part 22a and the memory 22b of the logical operation block 22. When being turned on, the MOS transistor SW2 supplies from the global power supply wire 23 the power VDD1 to the logic circuit part 21a and the memory 21b of the processor block 21.

It is noted that the global power supply wire 24 constantly supplies the power VSS to the logic circuit part 21a and the memory 21b of the processor block 21 and the logic circuit part 22a and the memory 22b of the logical operation block 22.

The source of the MOS transistor SW0 is connected with the drain of the MOS transistor SW3, thus the MOS transistors SW0 and SW3 are vertically connected. When the MOS transistor SW2 is turned off and the MOS transistor SW3 is turned on, the power VDD2 from the global power supply wire 25 is dropped by a voltage of approximately 0.1 V through an on resistance of the MOS transistor SW0, to be applied to the logic circuit part 21a and the memory 21b of the processor block 21.

The global power supply wire 25 of the power VDD2 and the MOS transistor SW3 are used only for a holding purpose in the processor block 21. Therefore, it is possible to reduce a size of the global power supply wire 25 in comparison to the global power supply wire 23, and an area for the MOS transistor SW3 can be made smaller than that of the MOS transistor SW2. Therefore, the global power supply wire 25 of the power VDD2 and the MOS transistor SW3 do not require a remarkably large increased in an area.

(1) At a Time of a Normal Operation (At a Time of Transmitting and Receiving Mode):

To the gates of SW1, SW2 and SW3, the high level (3.3 V) is supplied, SW1 and SW2 are turned on, thereby VDD1 (1.2 V) by which voltage a normal operation can be carried out is supplied to the processor block 21 and the logical operation block 22. At this time, SW3 is also turned on. However, the processor block 21 is cut off from the power VDD2 because a source voltage of the MOS transistor SW0 is 1.2 V, a voltage between the gate and source $V_{GS}$ is lower than the threshold voltage $V_{TH}$, and SW0 is turned off.

Another configuration may be considered in which the power VDD is 0.9 V and SW0 is not provided. However, in this case, it is necessary to carry out switching of turning on/off of SW2 and switching of turning on/off of SW3 completely simultaneously. It is difficult and thus is not practical to so completely simultaneously carry out switching operations of SW2 and SW3.

(2) At a Time of Intermittent Operation (At a Time of a Stand-By Operation):

(2-1) At a time of high-speed recovery (without a reset operation) being required:

At a time of non-operating (at a time of a stand-by operation), the low level (0 V) is supplied to the gates of SW1 and SW2 that are thus turned off, and thereby, the logical operation block 22 is completely cut off from the power VDD1, and the logical operation block 22 completely stops and consumes no power.

However, the high level (3.3 V) is supplied to the gate of SW3 that is thus still turned on. Therefore, the lower limit voltage (0.9 V) by which voltage a holding operation can be carried out is supplied to the processor block 21, and retention is carried out in which a holding operation is carried out while a leak current is reduced.

At a time of recovery, only it is necessary to turn on SW1 and SW2, reading of firmware is not necessary, and the processor block 21 can be recovered at a high speed.

(2-2) At a time of a non-operating time being long and a high-speed recovery being not required (with a reset operation):

At a time of non-operating (at a time of a stand-by operation), the low level (0 V) is supplied to the gates of SW1, SW2 and SW3 that are thus turned off, and thereby, the processor block 21 and the logical operation block 22 are completely cut off from the power VDD1 and the power VDD2, and completely stop (consume no power).

At a time of recovery, SW1, SW2 and SW3 are turned on, and, a time of starting up a reset operation (approximately a fixed time) in which an operation of reading firmware and a following operation are carried out is required, same as an initial operation, in the processor block 21. However, because an operating time is sufficiently shorter than a non-operating time, the starting up time may be ignored.

<Whether a Reset Operation is Carried Out>

In an intermittent operation (a stand-by operation) in a cellular phone, a non-operating time T (in which a power supply is broken) varies in a range of several tens of milliseconds through several seconds. However, a time of stating up a reset operation (for example, several milliseconds through several tens of milliseconds) and an operating time (for example, several milliseconds through several tens of milliseconds) are fixed and do not vary.

It is assumed that the processor block 21 occupies 1/10 times in a circuit size, consumes 1.5 times in an operating current and consumes 10 times in a leak current with respect to the other plural logical operation blocks 22. In this case, it is assumed that consumed current values of respective ones of the logic circuit parts 22a and the memories 22b, and the logic circuit part 21a and the memory 21b of the processor block 21, have ratios as depicted in FIG. 3 at a time of operation (Active), a time of a stand-by operation (Stand by), a time of retention, a time of non-operating (Off), and a time of reset (Reset). It is noted that a current at the time of a stand-by operation denotes a leak current.

Further, ratios of respective time lengths of a time of operating (Active), a time of stand-by or retention or non-operating (Off) and a time of reset (Reset) in a case where a ratio of times of non-operating/operating is small and a reset operation is not carried out; a case where a ratio of times of non-operating/operating is small and a reset operation is carried out; a case where a ratio of times of non-operating/operating is large and a reset operation is not carried out; and a case where a ratio of times of non-operating/operating is large and a reset operation is not carried out, are depicted in FIG. 4.

From the respective conditions depicted in

FIGS. 3 and 4, a ratio of total consumed currents in a case where a ratio of times of non-operating/operating is small and a reset operation is not carried out in the related art is 4.78 as depicted in FIG. 5. A ratio of total consumed currents in a case where a ratio of times of non-operating/operating is large and a reset operation is not carried out is 0.27. An average thereof is 2.52.

A ratio of total consumed currents in a case where a ratio of times of non-operating/operating is small and a reset operation is carried out in the related art is 11.50 as depicted in FIG. 5. A ratio of total consumed currents in a case where a ratio of times of non-operating/operating is large and a reset operation is carried out is 0.12. An average thereof is 5.81.

In comparison thereto, according to the present invention, a ratio of total consumed currents in a case where a ratio of times of non-operating/operating is small and a reset operation is not carried out is 3.29. A ratio of total consumed currents in a case where a ratio of times of non-operating/operating is large and a reset operation is carried out is 0.12. An average thereof is 1.17.

That is, where a reset operation is not carried out at all, a consumed current reduction effect of the present invention is approximately 1.5 times the related art. The consumed current reduction effect of the present invention is approximately 3.4 times with respect to the related-art circuit where a reset operation is necessarily carried out.

<Flowchart of Power Control>

Figure 6:
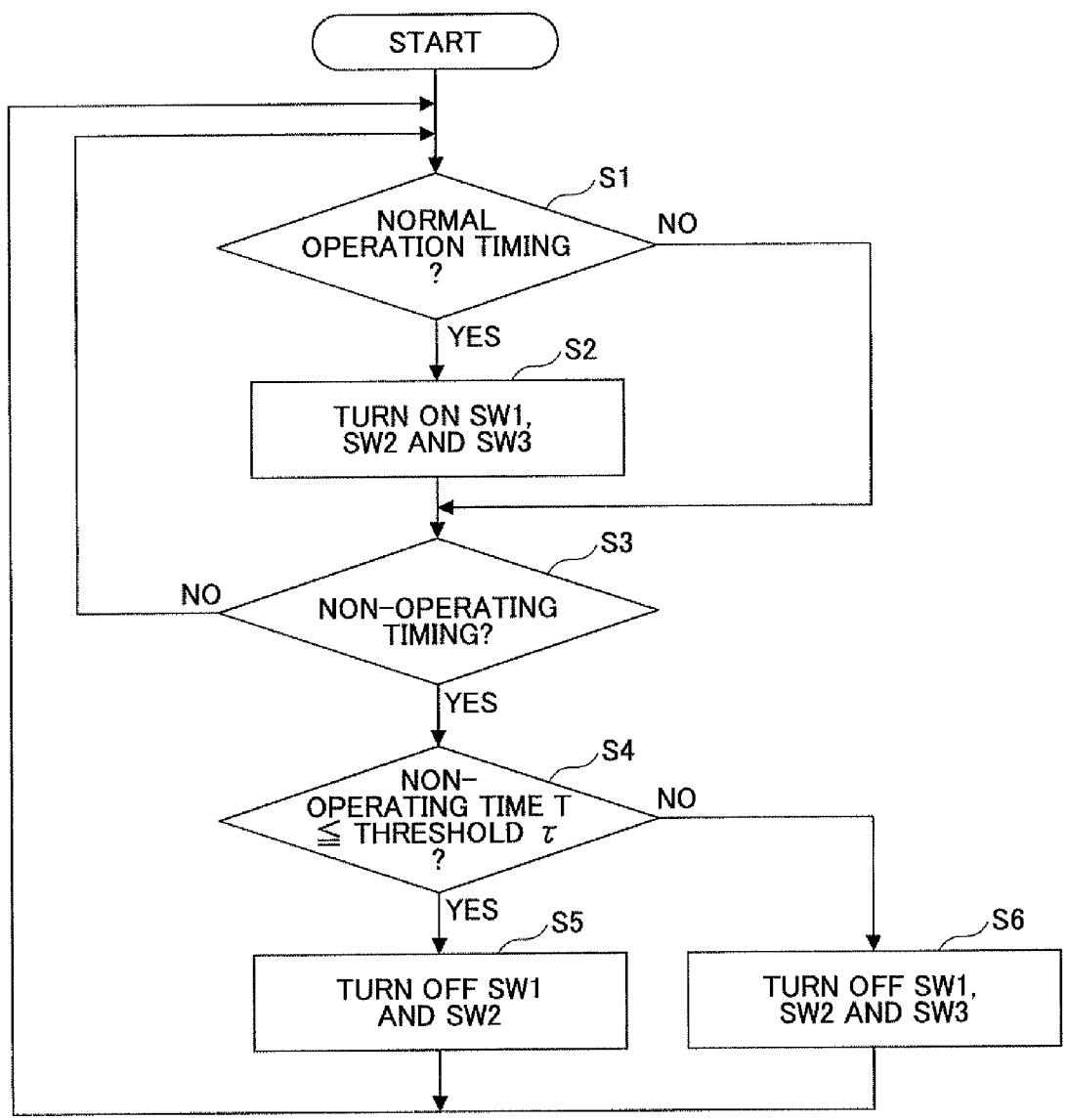
FIG. 6 is a flowchart of one embodiment of a power control process.

FIG. 6 depicts a flowchart of one embodiment of a power control process carried out by the power control part 26. In the figure, the power control part 26 determines in step S1 whether it is a normal operation timing. At a time of a normal operation time, the power control part 26 turns on SW1, SW2 and SW3 in step S2.

Next, the power control part 26 determines in step S3 whether it is a non-operating timing of a stand-by operation. When it is not a non-operating timing, the power control part 26 proceeds with step S1. When it is a non-operating timing, the power control part 26 proceeds with step S4.

In step S4, the power control part 26 determines whether a non-operating time T of an intermittent operation notified by a host apparatus exceeds a threshold T. The threshold corresponds to a non-operating time in which the total consumed current in the case where the a ratio of times of non-operating/operating is small according to the present invention becomes equal to the total consumed current in the case where the a ratio of times of non-operating/operating is large according to the present invention.

When the non-operating time T is equal to or less than the threshold T, the non-operating time is small and a high-speed recovery is required (without a reset operation). Therefore, the power control part 26 turns off SW1 and SW2 in step S5, and carries out retention of the processor block 21.

When the non-operating time T exceeds the threshold T, the non-operating time is large and a high-speed recovery is not required (with a reset operation). Therefore, the power control part 26 turns off SW1, SW2 and SW3 in step S6, and completely stops the processor block 21.

Second Embodiment

Figure 7:
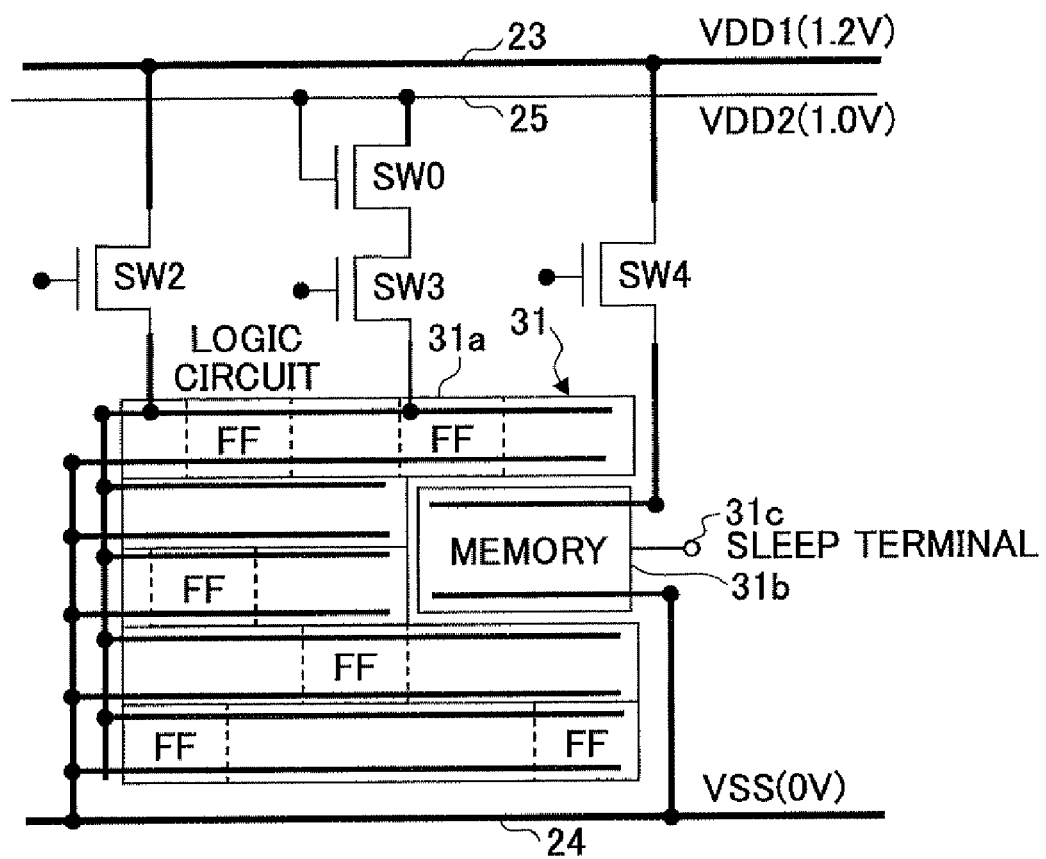
FIG. 7 is a configuration diagram of a second embodiment of a processor block.

FIG. 7 depicts a configuration diagram of a second embodiment of a processor block in a semiconductor integrated circuit according to the present invention. It is noted that a logical operation block 22 other than a processor has the same configuration as that in the first embodiment.

In the figure, the processor block 31 has a logic circuit part 31a and a memory 31b. The memory 31b has a sleep terminal 31c, and, when a sleep signal of the high level for example is supplied to the sleep terminal 31c, the memory 31b carries out retention and enters a sleep mode of power saving.

A global power supply wire 23 supplies a power VDD1 of a voltage by which voltage the logic circuit parts and the memories in the LSI chip 20 can carry out a normal operation, for example, 1.2 V. A global power supply wire 24 supplies a power VSS of, for example, 0 V. A global power supply wire 25 supplies a power VDD2 of a voltage slightly higher than the lower limit voltage (for example, 0.9 V), for example, 1.0 V. By the lower limit voltage, the logic circuit parts and the memories can carry out a holding operation.

Respective ones of n-channel MOS transistors SW2 through SW4 are turned on when a voltage higher than the power VDD1, for example, 3.3 V, to the gates. The power VDD2 is applied to the gate and drain of an n-channel MOS transistor SW0, and is turned on when a voltage between the gate and source $V_{GS}$ exceeds a threshold voltage $V_{TH}$ (for example, 0.1 V). A power control part 26 controls switching of turning on/off of SW2 through SW4.

The MOS transistor SW2 supplies the power VDD1 to the logic circuit part 31a of the processor block 31 from the global power supply wire 23 when being turned on. The MOS transistor SW4 supplies the power VDD1 to the memory 31b of the processor block 31 from the global power supply wire 23 when being turned on.

It is noted that the global power supply wire 24 constantly supplies the power VSS to the logic circuit part 31a and the memory 31b of the processor block 31 and the logic circuit part 22a and the memory 22b of the logical operation block 22.

The source of the MOS transistor SW0 is connected with the drain of the MOS transistor SW3, and thus the MOS transistors SW0 and SW3 are connected vertically. When the MOS transistor SW2 is turned off and the MOS transistor SW3 is turned on, the power VDD2 is supplied from the global power supply wire 25 to the logic circuit part 31a of the processor block 31 with being dropped by a voltage of approximately 0.1 V by an on resistance of the MOS transistor SW0.

At a time of a normal operation, the high level (3.3 V) is supplied to the gates of SW2 through SW4, and SW2 and SW4 are thus turned on. Thereby, to the processor block 31, the voltage VDD1 (1.2 V) is supplied by which voltage a normal operation can be carried out. At this time, SW3 is also turned on. However, because the source voltage of the MOS transistor SW0 is 1.2 V and the voltage between the gate and the source $V_{GS}$ is less than the threshold $V_{TH}$, SW0 is turned off and the processor block 31 is cut off from the power VDD2.

At a time of non-operating (without a reset operation), the low level (0 V) is supplied to the gate of SW2, the high level is supplied to SW3 and SW4, and the high level is supplied to the sleep terminal 31c. Thereby, the lower limit voltage (0.9 V) by which voltage a holding operation can be carried out, dropped by a voltage of approximately 0.1 V by an on resistance of the MOS transistor SW0, is supplied to the logic circuit part 31a of the processor block 31, and is maintained in a state in which a leak current is reduced. Further, the memory 31b carries out retention in the sleep mode.

Further, at a time of non-operating (with a reset operation), the low level (0 V) is supplied to the gates of SW2 through SW4 that are thus turned off, and thereby, the processor block 31 is completely cut off from the power VDD1 and the power VDD2, and completely stops (consumes 0 power).

Third Embodiment

Figure 8:
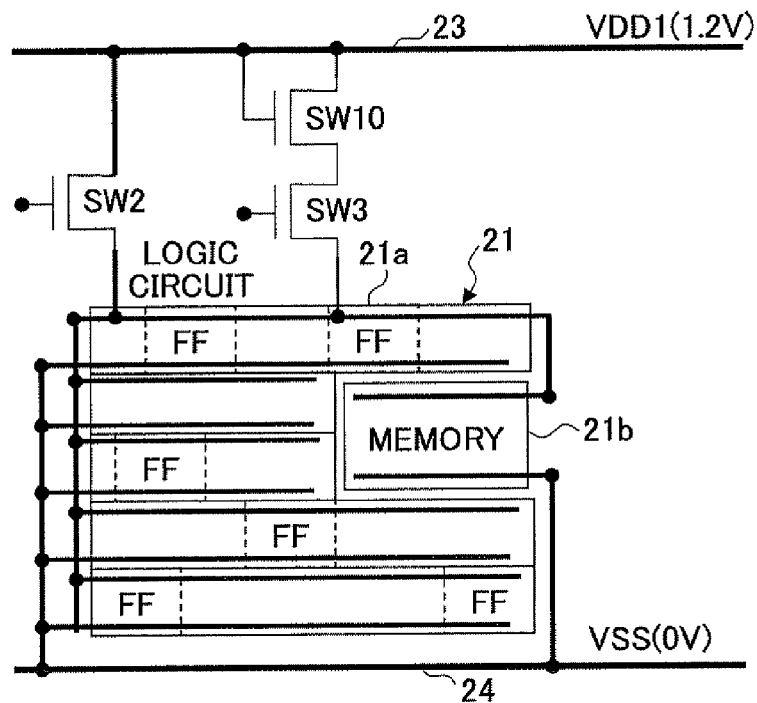
FIG. 8 is a configuration diagram of a third embodiment of a processor block.

FIG. 8 depicts a configuration diagram of a third embodiment of a processor block in a semiconductor integrated circuit according to the present invention. A logical operation block 22 other than a processor has a configuration the same as that in the first embodiment. In the third embodiment, no global power supply wire 25 is provided.

In the figure, a processor block 21 has a logic circuit part 21a and a memory 21b. A global power supply wire 23 supplies a power VDD1 of a voltage by which voltage the logic circuit parts and the memories in a LSI chip 20 can carry out a normal operation, for example, 1.2 V, a global power supply wire 24 supplies a power VSS of, for example, a voltage of 0 V, and no global power supply wire 25 is provided.

Each of n-channel MOS transistors SW2 and SW3 is turned on when a voltage higher than the power VDD1, for example, 3.3 V, is applied to its gate. A power VDD1 is applied to a gate and a drain of an n-channel MOS transistor SW10 that is turned on when a voltage between the gate and the source, $V_{GS}$ exceeds a threshold $V_{TH}$ (for example, 0.3 V). Switching of turning on and off of each of SW2 and SW3 is controlled by a power control part 26.

The MOS transistor SW2 supplies the power VDD1 to the logic circuit part 21a and the memory 21b of the processor block 21 from the global power supply wire 23 when being turned on.

It is noted that the global power supply wire 24 constantly supplies the power VSS to the logic circuit part 21a and the memory 21b of the processor block 21 and the logic circuit part 22a and the memory 22b of the logical operation block 22.

The source of the MOS transistor SW10 is connected with the drain of the MOS transistor SW3, and thus the MOS transistors SW10 and SW3 are vertically connected. When the MOS transistor SW2 is turned off and the MOS transistor SW3 is turned on, the global power supply line 23 supplies the power VDD1 to the logic circuit part 21a and the memory 22b of the processor block 21 with being dropped by a voltage of approximately 0.3 V by an on resistance of the MOS transistor SW10.

At a time of a normal operation, a high level (3.3 V) is supplied to the gates of SW2 and SW3, SW2 is turned on, and thereby, the voltage VDD1 (1.2 V) by which voltage a normal operation can be carried out is supplied to the processor block 21. At this time, SW3 is also turned on. However, SW10 is turned off because a source voltage of the MOS transistor SW10 is 1.2 V, and the voltage between the gate and the source $V_{GS}$ is less than the threshold $V_{TH}$.

At a time of non-operating (without a reset operation), a low level (0 V) is supplied to the gate of SW2, and the high level is supplied to the gate of SW3. Thereby, a lower limit voltage (0.9 V) by which voltage a holding operation can be carried out is supplied to the logic circuit part 21a and the memory 21b of the processor 21 with being dropped by a voltage of approximately 0.3 V by an on resistance of the MOS transistor SW10, and a state is held in which a leak current is reduced.

Further, at a time of non-operating (with a reset operation), the low level (0 V) is supplied to the gates of SW2 and SW3 that are thus turned off, and thereby, the processor block 21 is completely cut off from the power VDD1, and completely stops (consumes 0 power).

Fourth Embodiment

Figure 9:
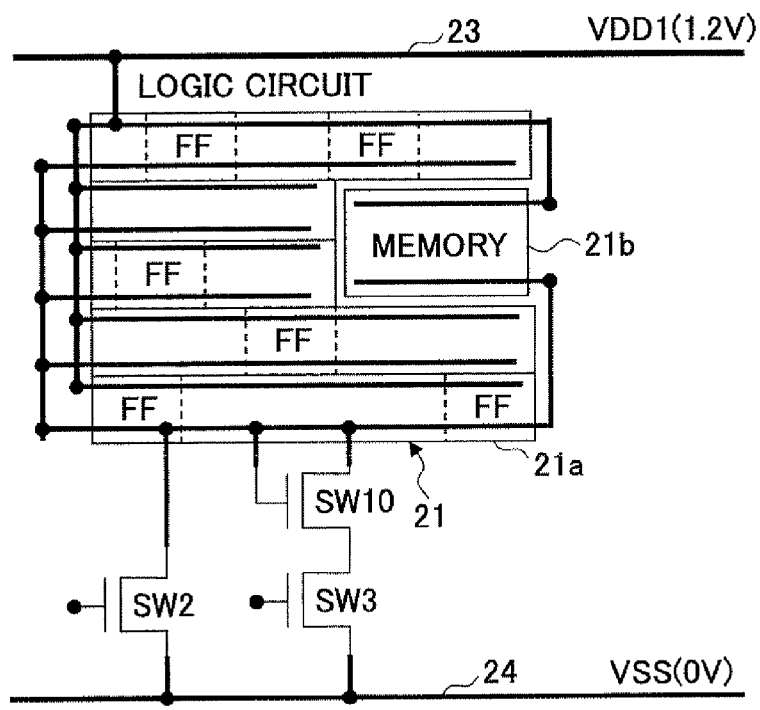
FIG. 9 is a configuration diagram of a fourth embodiment of a processor block.

FIG. 9 depicts a configuration diagram of a fourth embodiment of a processor block in a semiconductor integrated circuit according to the present invention. It is noted that a logical operation block 22 other than a processor has a configuration the same as that in the first embodiment. The fourth embodiment is different from the third embodiment in that SW2, SW3 and SW10 are provided to a power VSS that is a common voltage on a negative side.

In the figure, a processor block 21 has a logic circuit part 21a and a memory 21b. A global power supply wire 23 supplies a power VDD1 of a voltage by which voltage the logic circuit parts and the memories in a LSI chip 20 can carry out a normal operation, for example, 1.2 V, a global power supply wire 24 supplies a power VSS of a voltage, for example, 0V, and no global power supply wire 25 is provided.

Each of the n-channel MOS transistors SW2 and SW3 is turned on when a voltage higher than the power VDD1, for example, 3.3 V, is applied to its gate. A gate and a drain of the n-channel MOS transistor SW10 are connected to negative side power supply wires of the logic circuit part 21a and the memory 21b, the power VSS is applied to its source via SW3, and is turned on when a voltage between its gate and source $V_{GS}$ exceeds a threshold $V_{TH}$ (for example, 0.3 V). Switching of turning on/off of SW2 and SW3 is controlled by a power control part 26.

The MOS transistor SW2 supplies the power VSS to the logic circuit part 21a and the memory 21b of the processor block 21 when being turned on and being connected to the global power supply wire 24.

It is noted that the global power supply wire 23 constantly supplies the power VDD1 to the logic circuit part 21a and the memory 21b of the processor block 21 and the logic circuit part 22a and the memory 22b of the logical operation block 22.

A source of the MOS transistor SW10 is connected to a drain of the MOS transistor SW3, and thus the MOS transistors SW10 and SW3 are vertically connected. When the MOS transistor SW2 is turned off and the MOS transistor SW3 is turned on, the power VDD1 from the global power wire 23 flows to the power VSS through the logic circuit part 21a and the memory 21b of the processor block 21 with being dropped by a voltage of approximately 0.3 V by an on resistance of the MOS transistor SW10.

At a time of a normal operation, a high level (3.3 V) is supplied to the gates of SW2 and SW3, SW2 is turned on, and thus, a voltage VDD1 (1.2 V) by which voltage a normal operation can be carried out is supplied to the processor block 21. At this time, SW3 is also turned on. However, because a source voltage of the MOS transistor SW10 is 0 V, and a voltage between its gate and source $V_{GS}$ is less than the threshold $V_{TH}$, SW10 is turned off.

At a time of non-operating (without a reset operation), a low level (0 V) is supplied to the gate of SW2, and the high level is supplied to the gate of SW3. Thereby, a lower limit voltage (0.9 V) by which voltage a holding operation can be carried out is supplied to the logic circuit part 21a and the memory 21b of the processor block 21 with being dropped by a voltage of approximately 0.3 V by an on resistance of the MOS transistor SW10, and a state in which a leak current is reduced is held.

Further, at a time of non-operating (with a reset operation), the low level (0 V) is supplied to the gates of SW2 and SW3 that are turned off, and thus, the processor block 21 is completely cut off from the power VSS, and completely stops (consumes 0 power).

Fifth Embodiment

Figure 10:
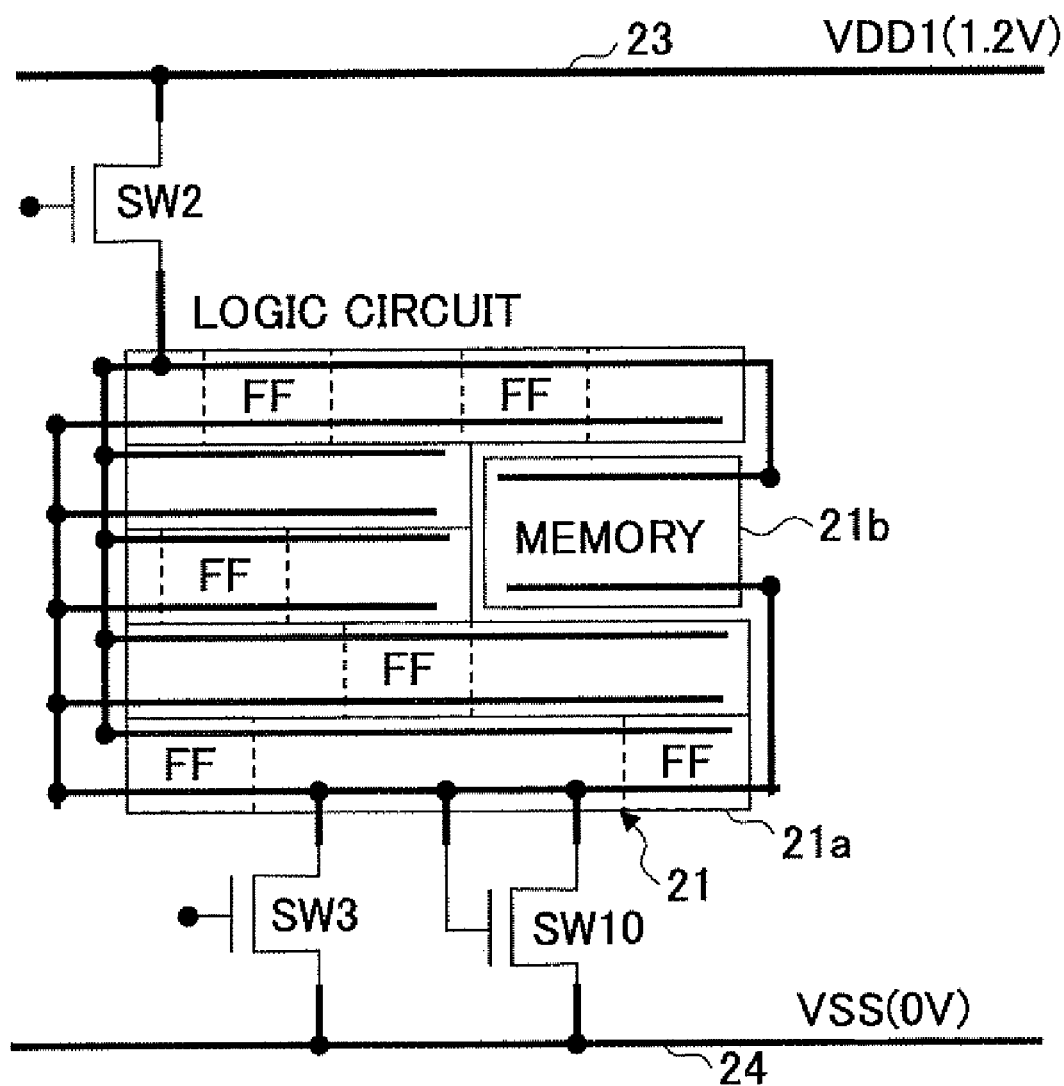
FIG. 10 is a configuration diagram of a fifth embodiment of a processor block.

FIG. 10 depicts a configuration diagram of a fifth embodiment of a processor block in a present invention. It is noted that a logical operation block 22 other than a processor has a configuration the same as that in the first embodiment. The fifth embodiment is different from the fourth embodiment in that SW2 is provided to a side of a power VDD1.

In the figure, a processor block 21 has a logic circuit part 21a and a memory 21b. A global power supply wire 23 supplies a power VDD1 of a voltage by which voltage the logic circuit parts and the memories in a LSI chip 20 can carry out a normal operation, for example, 1.2 V, a global power supply wire 24 supplies a power VSS of a voltage, for example, 0V, and no global power supply wire 25 is provided.

Each of the n-channel MOS transistors SW2 and SW3 is turned on when a voltage higher than the power VDD1, for example, 3.3 V, is applied to its gate. A gate and a drain of the n-channel MOS transistor SW10 are connected to negative side power supply wires of the logic circuit part 21a and the memory 21b, the power VSS is applied to its source, and is turned on when a voltage between its gate and source $V_{GS}$ exceeds a threshold $V_{TH}$ (for example, 0.3 V). Switching of turning on/off of SW2 and SW3 is controlled by a power control part 26.

The MOS transistor SW2 supplies the power VDD1 to the logic circuit part 21a and the memory 21b of the processor block 21 when being turned on and being connected to the global power supply wire 23. The MOS transistor SW3 supplies the power VSS to the logic circuit part 21a and the memory 21b of the processor block 21 when being turned on and being connected to the global power supply wire 24.

A source of the MOS transistor SW10 is connected to the global power supply wire 24. When the MOS transistor SW2 is turned on and the MOS transistor SW3 is turned off, the power VDD1 from the global power wire 23 flows to the power VSS through the logic circuit part 21a and the memory 22b of the processor block 21.

At a time of a normal operation, a high level (3.3 V) is supplied to the gates of SW2 and SW3 that are turned on, and thus, a voltage VDD1 (1.2 V) by which voltage a normal operation can be carried out is supplied to the processor block 21. At this time, because a source voltage of the MOS transistor SW10 is 0 V, and a voltage between its gate and source $V_{GS}$ is less than the threshold $V_{TH}$, SW10 is turned off.

At a time of non-operating (without a reset operation), the high level is supplied to the gate of SW2, and a low level (0 V) is supplied to the gate of SW3. Thereby, a lower limit voltage (0.9 V) is supplied to the logic circuit part 21a and the memory 21b of the processor block 21 with being dropped by a voltage of approximately 0.3 V by an on resistance of the MOS transistor SW10. By the lower limit voltage, a holding operation can be carried out. By doing so, a state in which a leak current is reduced is held.

Further, at a time of non-operating (with a reset operation), the low level (0 V) is supplied to the gates of SW2 and SW3 that are turned off, and thus, the processor block 21 is completely cut off from the power VSS, and completely stops (consumes 0 power).

Sixth Embodiment

Figure 11:
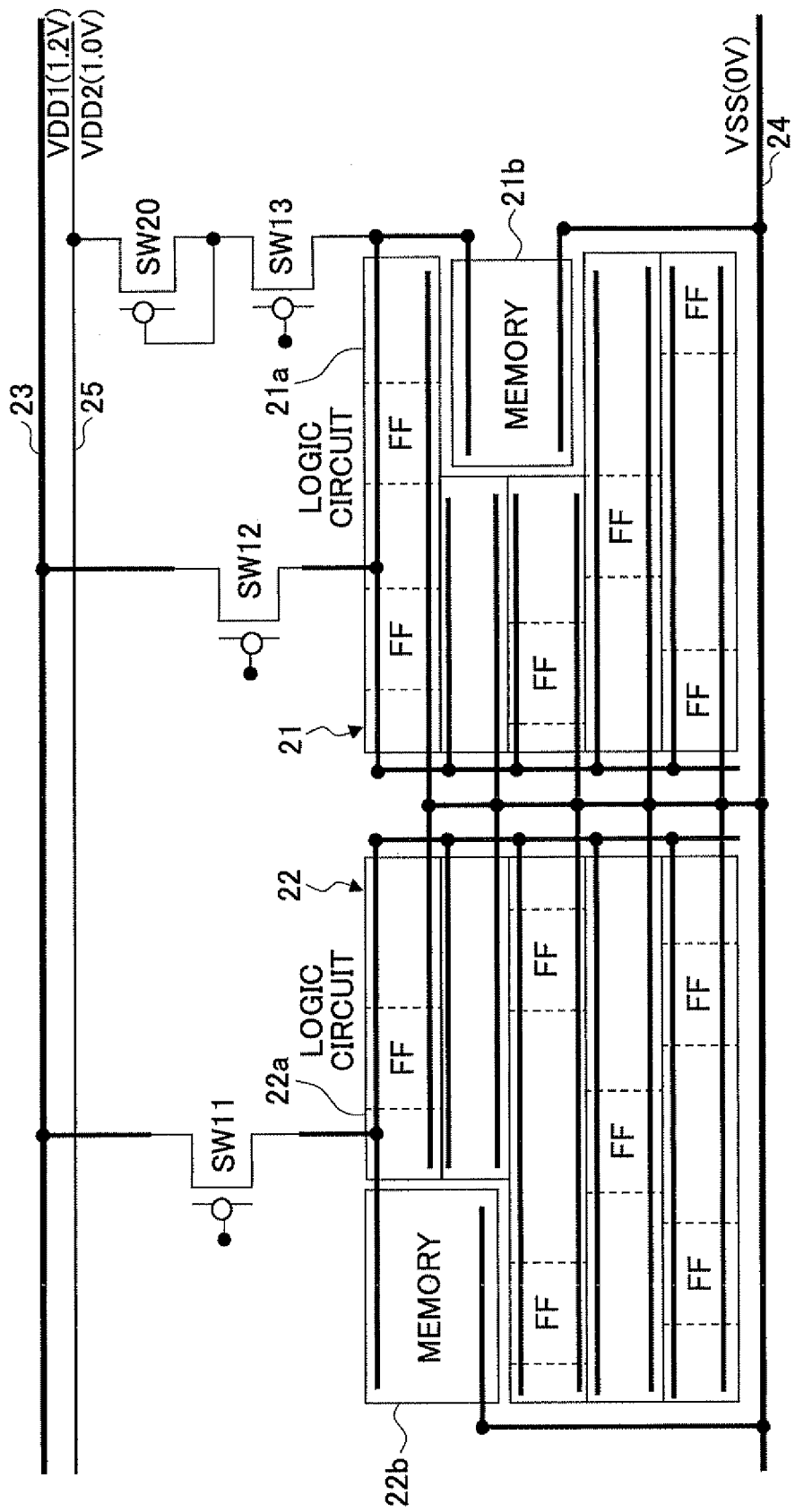
FIG. 11 is a configuration diagram of a sixth embodiment of a semiconductor integrated circuit according to the present invention.

FIG. 11 depicts a configuration diagram of a sixth embodiment of a semiconductor integrated circuit according to the present invention. The sixth embodiment is different from the first embodiment (FIG. 2) in that p-channel MOS transistors SW11, SW12, SW13 and SW20 are used.

In the figure, in an LSI chip 20, a processor block 21 and a logical operation block 22 other than a processor are provided. The processor block 21 has a logic circuit part 21a and a memory 21b. The logical operation block 22 has a logic circuit part 22a and a memory 22b.

A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and a global power supply wire 25 supplies a power VDD2 of a voltage slightly higher than a lower limit voltage (for example, 0.9 V) by which voltage the logic circuit parts and the memories can carry out a holding operation, for example, 1.0 V.

Respective ones of the p-channel MOS transistors SW11 through SW13 are turned on when the power VSS (0 V) is applied to their gates, and are turned off when a voltage higher than the power VDD1, for example, 3.3 V, are applied to the gates. A gate and a drain of SW20 are connected with a source of SW13, and is turned on when a voltage between the gate and source $V_{GS}$ exceeds a threshold voltage $V_{TH}$ (for example, 0.1 V). A power control part 26 controls switching of turning on/off of SW11 through SW13.

The MOS transistor SW11 supplies the power VDD1 to the logic circuit part 22a and the memory 22b of the logical operation block 22 from the global power supply wire 23 when being turned on. The MOS transistor SW12 supplies the power VDD1 to the logic circuit part 21a and the memory 21b of the processor block 21 from the global power supply wire 23 when being turned on.

It is noted that the global power supply wire 24 constantly supplies the power VSS to the logic circuit part 21a and the memory 21b of the processor block 21 and the logic circuit part 22a and the memory 22b of the logical operation block 22.

The drain of the MOS transistor SW20 is connected with the source of the MOS transistor SW13, and thus the MOS transistors SW20 and SW13 are connected vertically. When the MOS transistor SW12 is turned off and the MOS transistor SW13 is turned on, the power VDD2 is supplied from the global power supply wire 25 to the logic circuit part 21a and the memory 21b of the processor block 21 with being dropped by a voltage of approximately 0.1 V by an on resistance of the MOS transistor SW20.

It is noted that, because the global power supply wire 25 of the power VDD2 and the MOS transistor SW13 are provided only for holding in the processor block 21, it is possible to make the global power supply wire 25 thinner in comparison to the global power supply wire 23, it is possible to make a required area for the MOS transistor SW13 smaller in comparison to the MOS transistor SW12, and a remarkable increase in an area is required.

At a time of a normal operation, a low level (0 V) is supplied to the gates of SW11, SW12 and SW13, and SW11 and SW12 are thus turned on. Thereby, to the processor block 21 and the logical operation block 22, the voltage VDD1 (1.2 V) by which voltage a normal operation can be carried out is supplied. At this time, SW13 is also turned on.

However, because the drain voltage of the MOS transistor SW20 is 1.2 V, and the voltage between the gate and the source $V_{GS}$ is less than the threshold $V_{TH}$, SW20 is turned off and the processor block 21 is cut off from the power VDD2.

At a time of non-operating (without a reset operation), a high level (3.3 V) is supplied to the gates of SW11 and SW12 that are then turned off. Thereby, the logical operation block 22 is completely cut off from the power VDD1, and the processor block 21 completely stops and consumes 0 power.

However, since the low level (0 V) is supplied to the gate of SW13 and SW12 is kept turned on, the logical operation block 22 is not completely cut off, a supply of a lower limit voltage (0.9 V) by which voltage a holding operation can be carried out to the logical operation block 22 is continued, and the logical operation block 22 is maintained in a state in which a leak current is reduced.

Further, at a time of non-operating (with a reset operation), the high level is supplied to the gates of SW11, SW12 and SW13 that are thus turned off, and thereby, the processor block 21 and the logical operation block 22 are completely cut off from the power VDD1 and the power VDD2, and completely stop (consume 0 power).

At a time of a recovery, SW1, SW2 and SW3 are turned on, and, the same as in an initial operation, a time of starting up of a reset operation in which, first, reading firmware is carried out, is required for the processor block 21.

However, an operation time is sufficiently shorter than a non-operating time, the time of starting up can be ignored.

Seventh Embodiment

Figure 12:
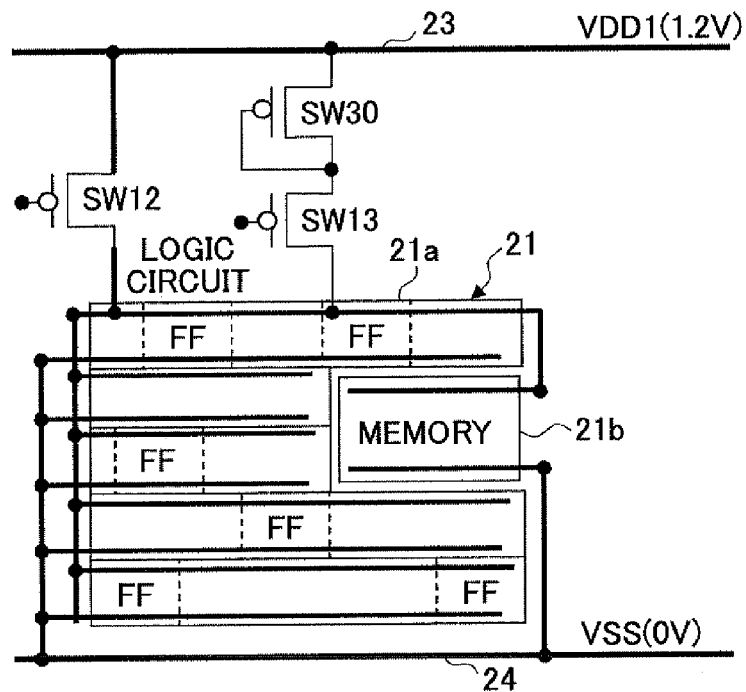
FIG. 12 is a configuration diagram of a seventh embodiment of a processor block.

FIG. 12 depicts a configuration diagram of a seventh embodiment of a processor block in a semiconductor integrated circuit according to the present invention. The seventh embodiment is different from the third embodiment (FIG. 8) in that p-channel MOS transistors SW12, SW13 and SW30 are used. It is noted that, also for a logical operation block 22, a p-channel MOS transistor SW11 is used instead of SW1.

In the figure, a processor block 21 has a logic circuit part 21a and a memory 21b. A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and no global power supply wire 25 is provided.

Respective ones of the p-channel MOS transistors SW12 and SW13 are turned on when the power VSS (0 V) is applied to their gates, and are turned off when a voltage higher than the power VDD1, for example, 3.3 V, are applied to the gates. A gate and a drain of SW30 are connected with a source of SW13, and is turned on when a voltage between the gate and source $V_{SS}$ exceeds a threshold voltage $V_{TH}$ (for example, 0.3 V). A power control part 26 controls switching of turning on/off of SW12 and SW13.

The MOS transistor SW12 supplies the power VDD1 to the logic circuit part 21a and the memory 21b of the processor block 21 from the global power supply wire 23 when being turned on. The MOS transistor SW13 supplies the power VDD1 to the logic circuit part 21a and the memory 21b of the processor block 21 from the global power supply wire 23 when being turned on.

It is noted that the global power supply wire 24 constantly supplies the power VSS to the logic circuit part 21a and the memory 21b of the processor block 21 and the logic circuit part 22a and the memory 22b of the logical operation block 22.

The drain of the MOS transistor SW30 is connected with the source of the MOS transistor SW13, and thus the MOS transistors SW30 and SW13 are connected vertically. When the MOS transistor SW12 is turned off and the MOS transistor SW13 is turned on, the power VDD1 is supplied from the global power supply wire 23 to the logic circuit part 21a and the memory 21b of the processor block 21 with being dropped by a voltage of approximately 0.3 V by an on resistance of the MOS transistor SW30.

At a time of a normal operation, a low level (0 V) is supplied to the gates of SW12 and SW13, and SW12 is turned on. Thereby, the voltage VDD1 (1.2 V) is supplied to the processor block 21, by which voltage a normal operation can be carried out. At this time, SW13 is also turned on. However, because the drain voltage of the MOS transistor SW30 is 1.2 V, and the voltage between the gate and the source $V_{GS}$ is less than the threshold $V_{TH}$, SW30 is turned off.

At a time of non-operating (without a reset operation), a high level (3.3 V) is supplied to the gates of SW12, and the low level is supplied to the gate of SW13. Thereby, a lower limit voltage (0.9 V) is supplied to the logic circuit part 21a and the memory 21b of the processor block 21, dropped by a voltage of approximately 0.3 V by an on resistance of the MOS transistor SW30. By the lower limit voltage, a holding operation can be carried out. The logic circuit part 21a and the memory 21b of the processor block 21 are thus maintained in a state in which a leak current is reduced.

Further, at a time of non-operating (with a reset operation), the high level (3.3 V) is supplied to the gates of SW12 and SW13 that are thus turned off, and thereby, the processor block 21 is completely cut off from the power VDD1 and the power VDD2, and completely stop (consume 0 power).

Eighth Embodiment

Figure 13:
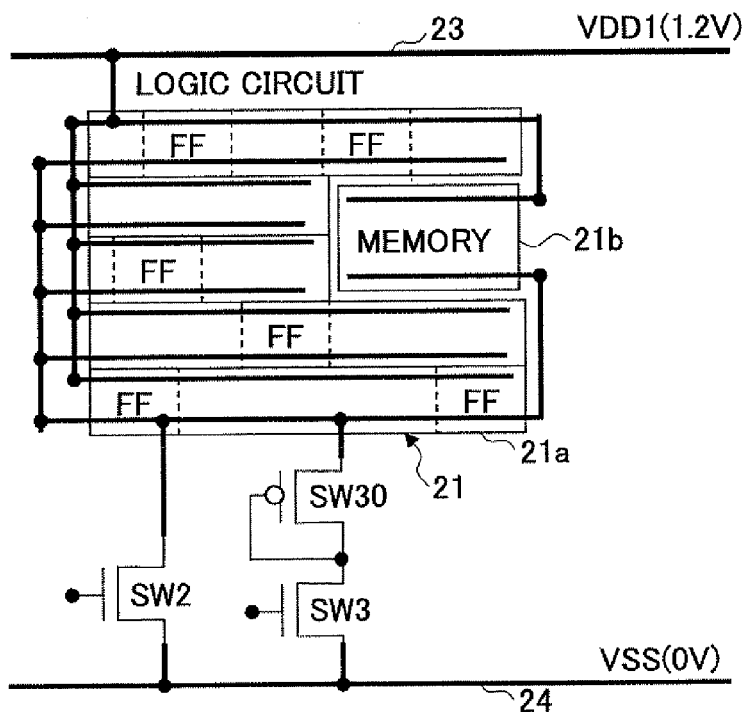
FIG. 13 is a configuration diagram of an eighth embodiment of a processor block.

FIG. 13 depicts a configuration diagram of an eighth embodiment of a processor block in a semiconductor integrated circuit according to the present invention. The eighth embodiment is different from the fourth embodiment (FIG. 9) in that p-channel MOS transistor SW30 is used.

In the figure, a processor block 21 has a logic circuit part 21a and a memory 21b. A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and no global power supply wire 25 is provided.

Respective ones of n-channel MOS transistors SW2 and SW3 are turned on when a voltage higher than the power VDD1, for example, 3.3 V, is applied to their gates. A source of the p-channel MOS transistor SW30 is connected to a negative side power supply wire of the logic circuit part 21a and the memory 21b, the power VSS is applied to its drain via SW3, and is turned on when a voltage between its gate and source $V_{GS}$ exceeds a threshold voltage $V_{TH}$ (for example, 0.3 V). A power control part 26 controls switching of turning on/off of SW2 and SW3.

The MOS transistor SW2 supplies the power VSS to the logic circuit part 21a and the memory 21b of the processor block 21 when being turned on and being connected to the global power supply wire 24.

It is noted that the global power supply wire 23 constantly supplies the power VDD1 to the logic circuit part 21a and the memory 21b of the processor block 21 and the logic circuit part 22a and the memory 22b of the logical operation block 22.

The drain of the MOS transistor SW30 is connected with the drain of the MOS transistor SW3, and thus the MOS transistors SW30 and SW3 are connected vertically. When the MOS transistor SW2 is turned off and the MOS transistor SW3 is turned on, the power VDD1 from the global power supply wire 23 flows to the power VSS through the logic circuit part 21a and the memory 21b of the processor block 21 with being dropped by a voltage of approximately 0.3 V by an on resistance of the MOS transistor SW30.

At a time of a normal operation, a high voltage (3.3 V) is supplied to the gates of SW2 and SW3, and SW2 is turned on. Thereby, the voltage VDD1 (1.2 V) is supplied to the processor block 21, by which voltage a normal operation can be carried out. At this time, SW3 is also turned on. However, because the drain voltage of the MOS transistor SW30 is 0 V, and the voltage between the gate and the source $V_{GS}$ is less than the threshold $V_{TH}$, SW30 is turned off.

At a time of non-operating (without a reset operation), a low level (0 V) is supplied to the gate of SW2, and the high level is supplied to the gate of SW3. Thereby, a lower limit voltage (0.9 V) is supplied to the logic circuit part 21a and the memory 21b of the processor block 21, dropped by a voltage of approximately 0.3 V by an on resistance of the MOS transistor SW30. By the lower limit voltage, a holding operation can be carried out. The logic circuit part 21a and the memory 21b of the processor block 21 are thus maintained in a state in which a leak current is reduced.

Further, at a time of non-operating (with a reset operation), the low level (0 V) is supplied to the gates of SW2 and SW3 that are thus turned off, and thereby, the processor block 21 is completely cut off from the power VSS, and completely stops (consumes 0 power).

Ninth Embodiment

Figure 14:
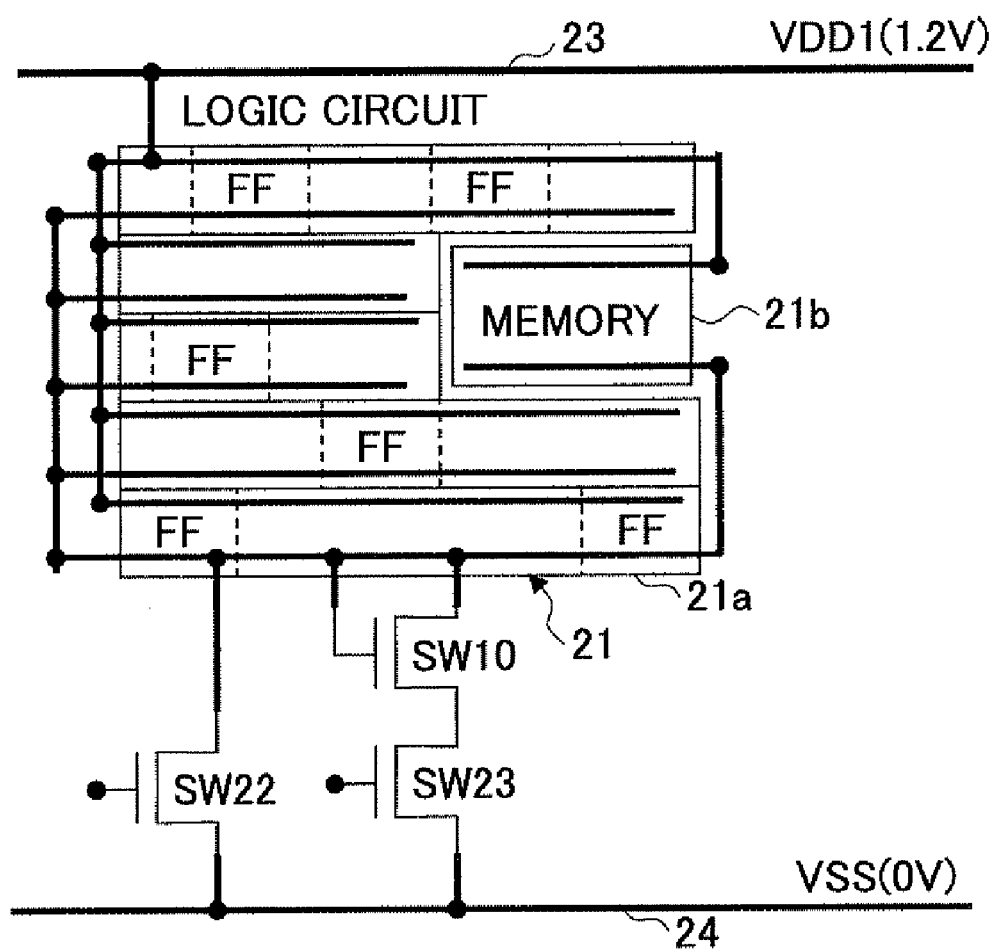
FIG. 14 is a configuration diagram of a ninth embodiment of a processor block.

FIG. 14 depicts a configuration diagram of a ninth embodiment of a processor block in a semiconductor integrated circuit according to the present invention. The ninth embodiment is different from the fourth embodiment (FIG. 9) in that n-channel MOS transistors SW22 and SW23 having gates longer than that of an ordinary transistor that is turned on by a gate voltage of 1.2 V and thus having leak currents reduced to be the same as that of SW2 and SW3 are used instead of SW2 and SW3 that are turned on by a gate voltage of 3.3 V and have small leak currents. It is noted that, also for a logical operation block 22, an n-channel MOS transistor SW21 the same as SW22 is used instead of SW1.

In the figure, a processor block 21 has a logic circuit part 21a and a memory 21b. A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and no global power supply wire 25 is provided.

Respective ones of the n-channel MOS transistors SW22 and SW23 are turned on when 1.2 V is applied to their gates. A gate and a drain of an n-channel MOS transistor SW10 are connected to a negative side power supply wire of the logic circuit part 21a and the memory 21b, the power VSS is applied to its source via SW23, and is turned on when a voltage between its gate and source $V_{GS}$ exceeds a threshold voltage $V_{TH}$ (for example, 0.3 V). A power control part 26 controls switching of turning on/off of SW22 and SW23.

The MOS transistor SW22 supplies the power VSS to the logic circuit part 21a and the memory 21b of the processor block 21 when being turned on and being connected to the global power supply wire 24. The MOS transistor SW23 supplies the power VSS to the logic circuit part 21a and the memory 21b of the processor block 21 when being turned on and being connected to the power supply wire 24.

It is noted that the global power supply wire 23 constantly supplies the power VDD1 to the logic circuit part 21a and the memory 21b of the processor block 21 and the logic circuit part 22a and the memory 22b of the logical operation block 22.

The source of the MOS transistor SW10 is connected with the drain of the MOS transistor SW23, and thus the MOS transistors SW10 and SW23 are connected vertically. When the MOS transistor SW22 is turned off and the MOS transistor SW23 is turned on, the power VDD1 from the global power supply wire 23 flows to the power VSS through the logic circuit part 21a and the memory 21b of the processor block 21 and is dropped by a voltage of approximately 0.3 V by an on resistance of the MOS transistor SW10.

At a time of a normal operation, a high voltage (1.2 V) is supplied to the gates of SW22 and SW23, and SW22 is turned on. Thereby, to the processor block 21, the voltage VDD1 (1.2 V) by which voltage a normal operation can be carried out is supplied. At this time, SW23 is also turned on. However, because the drain voltage of the MOS transistor SW10 is 0 V, and the voltage between the gate and the source $V_{GS}$ is less than the threshold $V_{TH}$, SW10 is turned off.

At a time of non-operating (without a reset operation), a low level (0 V) is supplied to the gate of SW22, and the high level is supplied to the gate of SW23. Thereby, to the logic circuit part 21a and the memory 21b of the processor block 21, a lower limit voltage (0.9 V), dropped by a voltage of approximately 0.3 V by an on resistance of the MOS transistor SW10, by which voltage a holding operation can be carried out, is supplied, and the logic circuit part 21a and the memory 21b of the processor block 21 are maintained in a state in which a leak current is reduced.

Further, at a time of non-operating (with a reset operation), the low level (0 V) is supplied to the gates of SW22 and SW23 that are thus turned off, and thereby, the processor block 21 is completely cut off from the power VSS, and completely stops (consumes 0 power).

Tenth Embodiment

Figure 15:
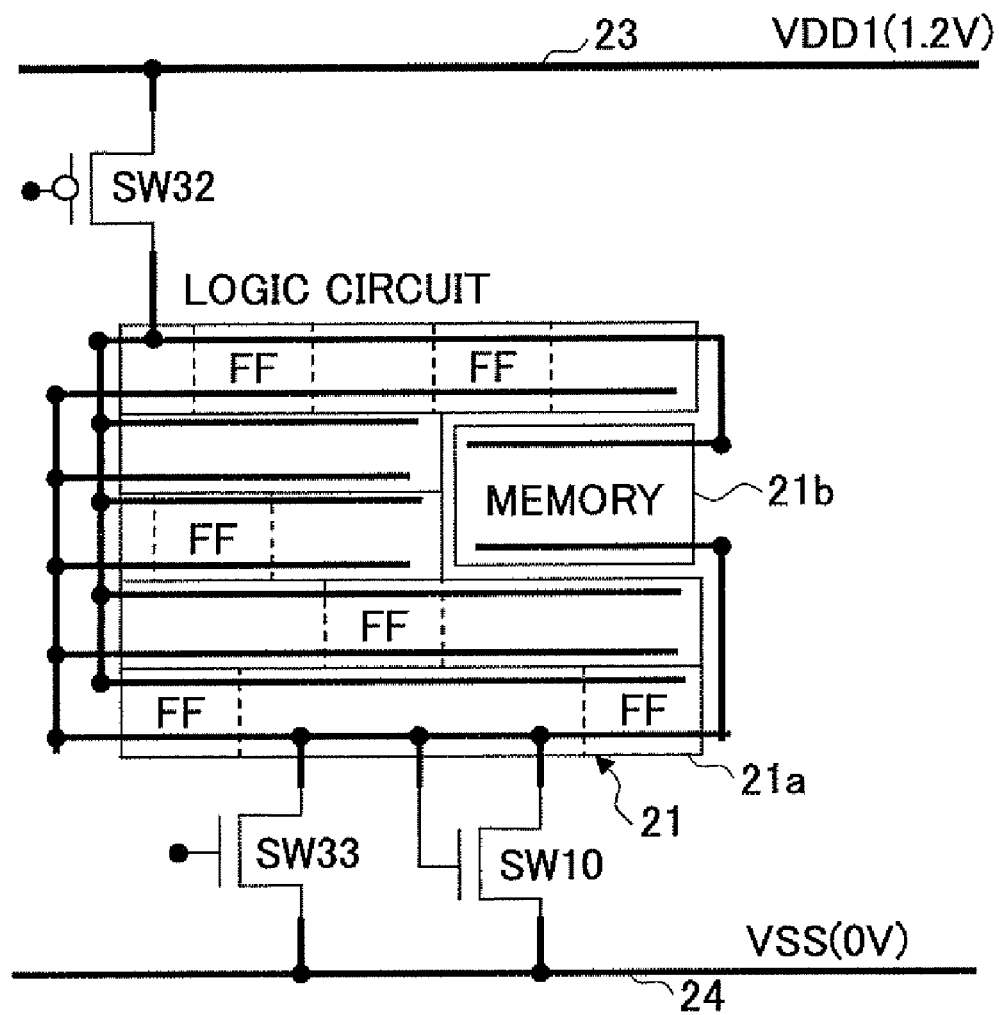
FIG. 15 is a configuration diagram of a tenth embodiment of a processor block.

FIG. 15 depicts a configuration diagram of a tenth embodiment of a processor block in a semiconductor integrated circuit according to the present invention. It is noted that, a logical operation block 22 other than a processor is the same as that in the first embodiment. The tenth embodiment is different from the fifth embodiment (FIG. 10) in that a p-channel MOS transistors SW32 that is turned off by a gate voltage of 1.2 V and an n-channel MOS transistor SW33 that is turned off by a gate voltage of 1.2 V, having gates longer than that of an ordinary transistor that is turned on by a gate voltage of 1.2 V and thus having leak currents reduced to be the same as that of SW2 are used instead of SW2 and SW3 that are turned on by a gate voltage of 3.3 V and have small leak currents.

It is noted that, also for a logical operation block 22, an n-channel MOS transistor SW21 the same as SW33 is used instead of SW1.

In the figure, a processor block 21 has a logic circuit part 21a and a memory 21b. A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and no global power supply wire 25 is provided.

The p-channel MOS transistors SW32 is turned off when 1.2 V is applied to its gate, and the n-channel MOS transistor S33 is turned on when 1.2 V is applied to its gate. A gate and a drain of an n-channel MOS transistor SW10 are connected to a negative side power supply wire of the logic circuit part 21a and the memory 21b, the power VSS is applied to its drain, and is turned on when a voltage between its gate and source $V_{GS}$ exceeds a threshold voltage $V_{TH}$ (for example, 0.3 V). A power control part 26 controls switching of turning on/off of SW32 and SW33.

The MOS transistor SW32 supplies the power VDD1 to the logic circuit part 21a and the memory 21b of the processor block 21 when being turned on and being connected to the global power supply wire 23. The MOS transistor SW33 supplies the power VSS to the logic circuit part 21a and the memory 21b of the processor block 21 when being turned on and being connected to the power supply wire 24.

The source of the MOS transistor SW32 is connected to the global power supply wire 23, and when the MOS transistor SW32 is turned on and the MOS transistor SW33 is turned on, the power VDD1 from the global power supply wire 23 flows to the power VSS through the logic circuit part 21a and the memory 21b of the processor block 21.

At a time of a normal operation, a low voltage (0 V) is supplied SW32 and a high level (1.2 V) is supplied to the gate of SW33, and SW32 and SW33 are turned on. Thereby, to the processor block 21, the voltage VDD1 (1.2 V) is supplied by which voltage a normal operation can be carried out. At this time, because the source voltage of the MOS transistor SW10 is 0 V, and the voltage between the gate and the source $V_{GS}$ is less than the threshold $V_{TH}$, SW10 is turned off.

At a time of non-operating (without a reset operation), the low level is supplied to the gate of SW32, and the low level (0 V) is supplied to the gate of SW33. Thereby, to the logic circuit part 21a and the memory 21b of the processor block 21, a lower limit voltage (0.9 V), dropped by a voltage of approximately 0.3 V by an on resistance of the MOS transistor SW10, by which voltage a holding operation can be carried out, is supplied, and the logic circuit part 21a and the memory 21b of the processor block 21 are maintained in a state in which a leak current is reduced.

Further, at a time of non-operating (with a reset operation), the high level is supplied to the gate of SW32, the low level is supplied to the gate of SW33, and SW32 and SW33 are turned off.

Thereby, the processor block 21 is completely cut off from the power VDD1 and the power VSS, and completely stops (consumes 0 power).

Eleventh Embodiment

Figure 16:
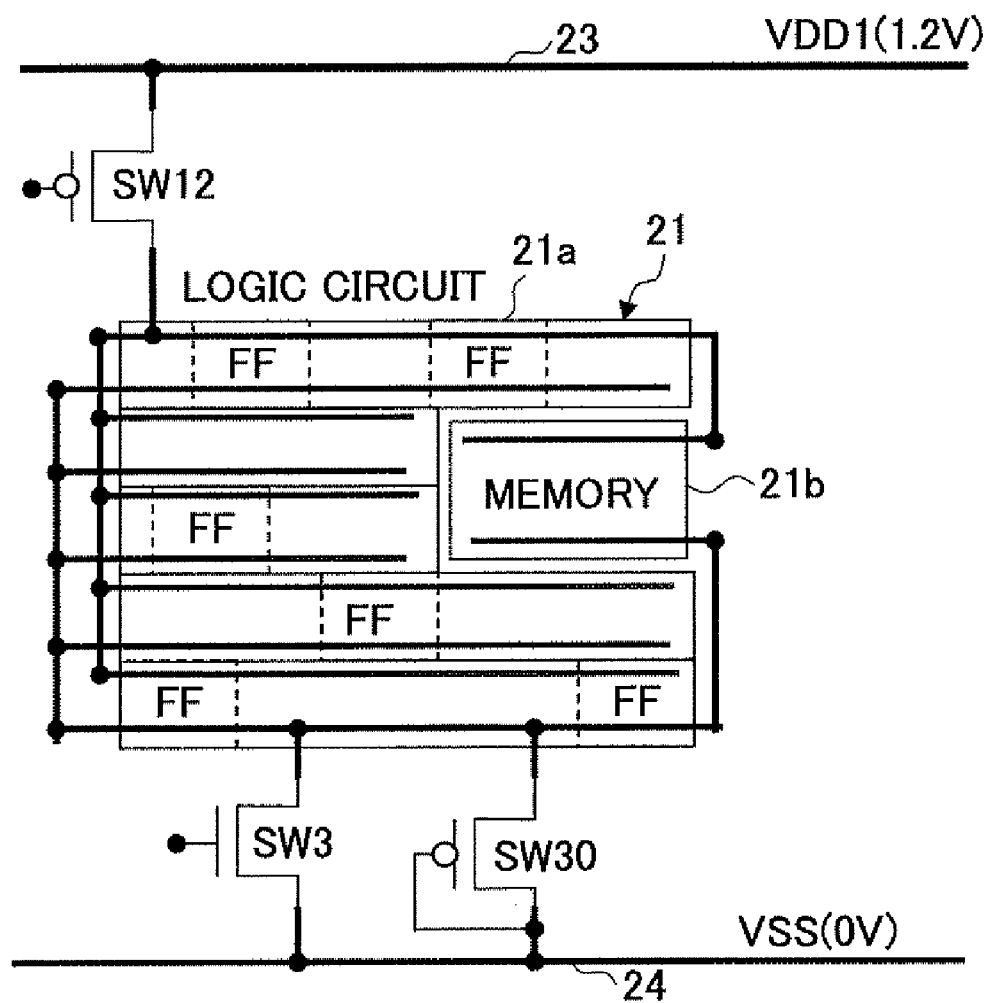
FIG. 16 is a configuration diagram of an eleventh embodiment of a processor block.

FIG. 16 depicts a configuration diagram of an eleventh embodiment of a processor block in a semiconductor integrated circuit according to the present invention. It is noted that, a logical operation block 22 other than a processor is the same as that in the first embodiment. The eleventh embodiment is different from the fifth embodiment (FIG. 10) in that p-channel MOS transistors SW12 and SW30 are used. It is noted that, also for a logical operation block 22, a p-channel MOS transistor SW11 is used instead of SW1.

In the figure, a processor block 21 has a logic circuit part 21*a* and a memory 21*b*. A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and no global power supply wire 25 is provided.

The p-channel MOS transistors SW12 is turned off when 3.3 V is applied to its gate, and the n-channel MOS transistor S3 is turned on when 3.3 V is applied to its gate. A gate and a drain of an n-channel MOS transistor SW30 are connected to VSS, and is turned on when a voltage between its gate and source $V_{GS}$ exceeds a threshold voltage $V_{TH}$ (for example, 0.3 V). A power control part 26 controls switching of turning on/off of SW3 and SW12.

The MOS transistor SW12 supplies the power VDD1 to the logic circuit part 21*a* and the memory 21*b* of the processor block 21 when being turned on and being connected to the global power supply wire 23. The MOS transistor SW3 supplies the power VSS to the logic circuit part 21*a* and the memory 21*b* of the processor block 21 when being turned on and being connected to the power supply wire 24.

The source of the MOS transistor SW12 is connected to the global power supply wire 23, and when the MOS transistor SW12 is turned on and the MOS transistor SW3 is turned on, the power VDD1 from the global power supply wire 23 flows to the power VSS through the logic circuit part 21*a* and the memory 21*b* of the processor block 21.

At a time of a normal operation, a low voltage (0 V) is supplied SW12 and a high level (3.3 V) is supplied to the gate of SW3, and SW12 and SW3 are turned on. Thereby, to the processor block 21, the voltage VDD1 (1.2 V) by which voltage a normal operation can be carried out is supplied. At this time, because the drain voltage of the MOS transistor SW30 is 0 V, and the voltage between the gate and the source $V_{GS}$ is less than the threshold $V_{TH}$, SW30 is turned off.

At a time of non-operating (without a reset operation), the low level is supplied to the gate of SW12, and the low level is supplied to the gate of SW3. Thereby, to the logic circuit part 21*a* and the memory 21*b* of the processor block 21, a lower limit voltage (0.9 V), dropped by a voltage of approximately 0.3 V by an on resistance of the MOS transistor SW30, by which voltage a holding operation can be carried out, is supplied, and the logic circuit part 21*a* and the memory 21*b* of the processor block 21 are maintained in a state in which a leak current is reduced.

Further, at a time of non-operating (with a reset operation), the high level is supplied to the gate of SW12, the low level is supplied to the gate of SW3, and SW12 and SW3 are turned off.

Thereby, the processor block 21 is completely cut off from the power VDD1 and the power VSS, and completely stops (consumes 0 power).

Twelfth Embodiment

Figure 17:
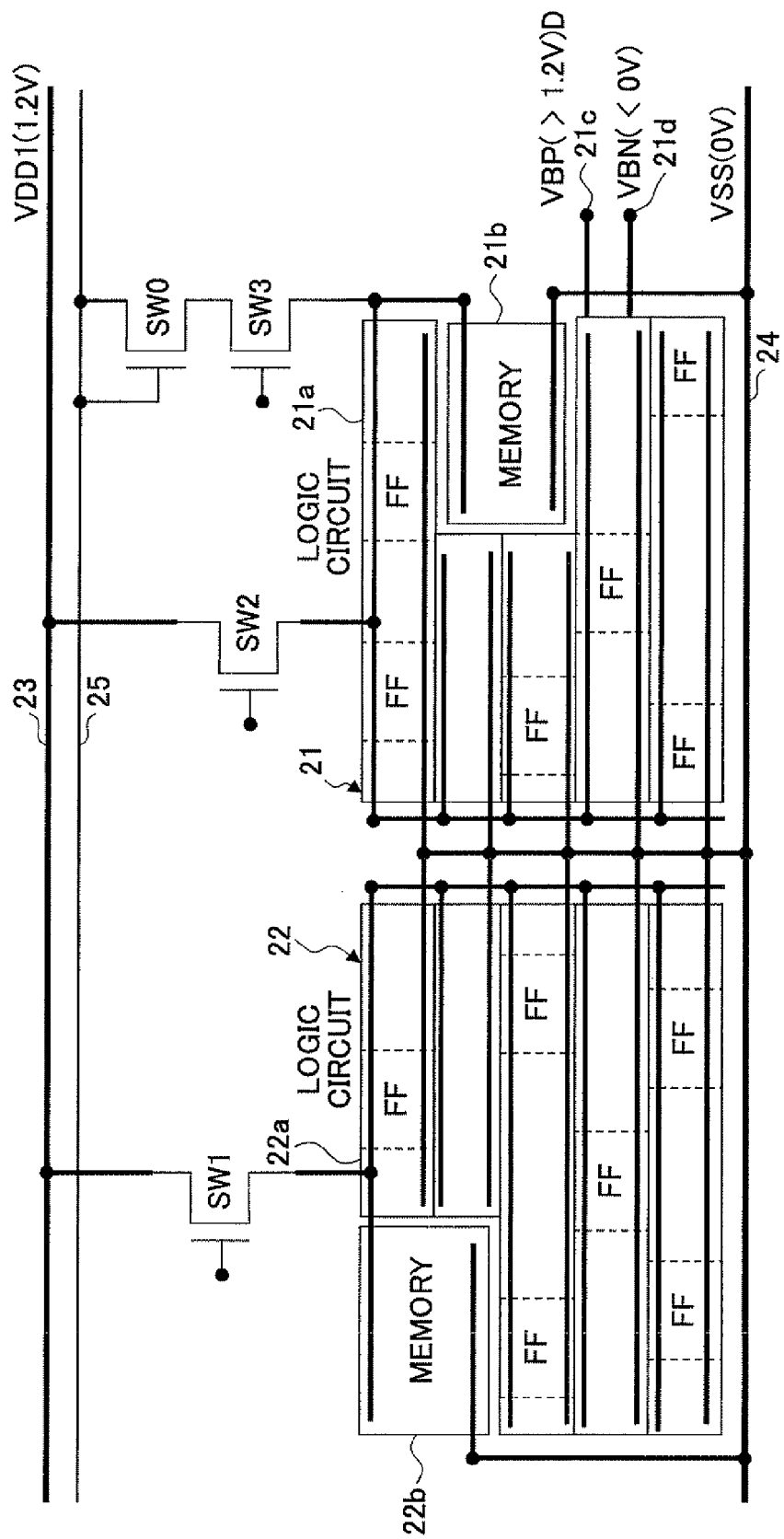
FIG. 17 is a configuration diagram of a twelfth embodiment of a semiconductor integrated circuit according to the present invention.

FIG. 17 depicts a configuration diagram of a twelfth embodiment of a semiconductor integrated circuit according to the present invention. In the figure, in a LSI chip 20, a processor block 21 and a logical operation block 22 other than a processor are provided. The processor block 21 has a logic circuit part 21*a* and a memory 21*b*, and the logical operation block 22 includes a logic circuit part 22*a* and a memory 22*b*.

To the logic circuit part 21*a* of the processor block 21, back bias voltages VBP and VBN are supplied to terminals 21*c* and 21*d* from a back bias control circuit, not shown. VBP is a back bias voltage to be applied to p-channel wells and VBN is a back bias voltage to be applied to n-channel wells.

A global power supply wire 23 supplies a power VDD1 of a voltage by which voltage the logic circuit parts and the memories in the LSI chip 20 can carry out a normal operation, for example, 1.2 V, a global power supply wire 24 supplies a power VSS of, for example, 0 V, and a global power supply wire 25 supplies a voltage VDD2 that is slightly higher than a lower limit voltage (for example, 0.9 V), by which voltage the logical circuit parts and the memories can carry out a holding operation, for example, 1.0 V.

Respective ones of n-channel transistors SW1 through SW3 are transistors that are turned on when a voltage that is higher than the power VDD1, for example, 3.3 V, is applied to their gates. Therefore, it is possible to reduce leak currents of SW1 through SW3 when a voltage 0 V is applied to the gates to be lower in comparison to a normal transistor that is turned on by a gate voltage of 1.2V. A power control part 26 controls switching of turning on/off of SW1 through SW3.

The power VDD2 is applied to a gate and a drain of the n-channel MOS transistor SW0, and is turned on when a voltage $V_{GS}$ between the gate and a source exceeds a threshold voltage $V_{TH}$ (for example, 0.1 V).

The MOS transistor SW1 supplies the power VDD1 to the logic circuit part 22*a* and the memory 22*b* of the logical operation block 22 from the power supply wire 23 when being turned on. The MOS transistor SW2 supplies the power VDD1 to the logic circuit part 21*a* and the memory 21*b* of the processor block 21 from the power supply wire 23 when being turned on.

It is noted that the global power supply wire 24 constantly supplies the power VSS to the logic circuit part 21*a* and the memory 21*b* of the processor block 21 and the logical circuit part 22*a* and the memory 22*b* of the logical operation block 22.

The source of the MOS transistor SW0 is connected to the drain of the MOS transistor SW3, and SW0 and SW3 are vertically connected. When the MOS transistor SW2 is turned off and the MOS transistor SW3 is turned on, the power VDD2 is supplied to the logic circuit part 21*a* and the memory 21*b* of the processor block 21 from the global power supply wire 25 with being dropped by a voltage of approximately 0.1 V by an on resistance of the MOS transistor SW0.

At a time of a normal operation, a high voltage is supplied to the gates of SW1 through SW3, SW2 and SW3 are turned on, and, to the processor block 21, the voltage VDD1 (1.2 V) by which voltage a normal operation can be carried out is supplied.

At this time, SW3 is turned on. However, the source voltage of the MOS transistor SW0 is 0 V, and the voltage between the gate and the source $V_{GS}$ is less than the threshold $V_{TH}$, SW0 is turned off. Therefore, the processor block 21 is cut off from the power VDD2. Further, VBP=1.2 V and VBN=0 V are supplied to the terminals 21c and 21d.

At a time of non-operating (without a reset operation), a low level (0 V) is supplied to the gate of SW2, the high level is supplied to the gate of SW3, and VPN>1.2 V and VBN<0 V are supplied to the terminals 21c and 21d. Thereby, a lower limit voltage (0.9 V) to the processor block 21, dropped by a voltage of approximately 0.1 V by an on resistance of the MOS transistor SW0. By the lower limit voltage, a holding operation can be carried out, is supplied. The processor block 21 is thus maintained in a state in which a leak current is reduced. Further, as a result of VBP>1.2V and VBN<0 V being supplied to the terminals 21c and 21d, it is possible to further reduce the leak current in the logic circuit part 21a of the processor block 21.

Further, at a time of non-operating (with a reset operation), the low level (0 V) is supplied to the gates of SW1 through SW3 that are then turned off, and thereby, the logical operation block 22 and the processor block 21 are completely cut off from the power VDD1 and the power VDD2, and completely stop (consume 0 power).

It is possible to carry out back bias control on the logical circuit parts 21a of the processor block 21 in the third through eleventh embodiments, and it is possible to change the processor block into the processor blocks 31 and carry out a sleep control of the memories 31b. Further, it is possible to carry out back bias control on the logic circuit parts 21a of the processor blocks 21 in the first through eleventh embodiments. Thus, embodiments are not limited to the above-mentioned embodiments.

Thus, in a case where an intermittent operation is carried out, it is possible to reduce a leak current and achieve a plurality of recovery modes, without requiring a remarkable increase in an area, by achieving a configuration such that, it is possible to supply the lower limit voltage by which voltage holding data is possible only to the processor block for a case where a non-operating time is short and high speed recovery is required, and it is possible to cut off power of the processor block for a case where a non-operating time is long and high speed recovery is not required.

It is noted that in the above-mentioned embodiments, the MOS transistor SW2 is used as an example of second switching part, the MOS transistor SW3 is used as an example of third switching part, and the MOS transistor SW0 is used as an example of fourth switching part.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present disclosure have been described in detail, it should be understood that various changes, substitutions, and alterations could be made hereto without departing from the spirit and scope of the invention.

What is claimed is:

1. A semiconductor integrated circuit that carries out intermittent operation, the semiconductor integrated circuit comprising:
    a processor block;
    a logical operation block other than a processor;
    a first switch part configured to supply a normal operation voltage to the logical operation block other than a processor;
    a second switch part configured to supply the normal operation voltage to the processor block;
    a third switch part configured to supply a data holding voltage lower than the normal operation voltage to the processor block; and
    a fourth switch part configured to be turned on, when the second switch part is turned off and the third switch part is turned on, and supply the data holding voltage to the processor block,
    wherein the fourth switch part generates the data holding voltage by using a voltage drop,
    the second switch part is connected to a first power supply wire that supplies the normal operation voltage, and the third and fourth switch parts are serially connected, and are connected to a second power supply wire that supplies a voltage lower than the normal operation voltage and higher than the data holding voltage.

2. The semiconductor integrated circuit as claimed in claim 1, wherein:
    the second switch part is connected to a first power supply wire that supplies the normal operation voltage, and
    the third and fourth switch parts are serially connected, and are connected to the first power supply wire.

3. The semiconductor integrated circuit as claimed in claim 1, wherein:
    the second switch part is connected to a third power supply wire that supplies a common voltage, and
    the third and fourth switch parts are serially connected, and are connected to the third power supply wire.

4. The semiconductor integrated circuit as claimed in claim 1, wherein:
    any one of the first through fourth switch parts comprises an n-channel MOS transistor.

5. The semiconductor integrated circuit as claimed in claim 1, wherein:
    any one of the first through fourth switch parts comprises a p-channel MOS transistor.

6. The semiconductor integrated circuit as claimed in claim 4, wherein:
    any one of the first through third switch parts comprises a MOS transistor that is turned on or off by a gate voltage higher than the normal operation voltage.

7. The semiconductor integrated circuit as claimed in claim 5, wherein:
    any one of the first through third switch parts comprises a MOS transistor that is turned on or off by a gate voltage higher than the normal operation voltage.

8. The semiconductor integrated circuit as claimed in claim 4, wherein:
    any one of the first through third switch parts comprises a MOS transistor that has a leak current the same as that of another MOS transistor that is turned on or off by a gate voltage higher than the normal operation voltage, having a gate length longer than that of the other MOS transistor, is turned on or off by a gate voltage of the normal operation voltage.

9. The semiconductor integrated circuit as claimed in claim 5, wherein:
    any one of the first through third switch parts comprises a MOS transistor that has a leak current the same as that of another MOS transistor that is turned on or off by a gate voltage higher than the normal operation voltage, having a gate length longer than that of the other MOS transistor, is turned on or off by a gate voltage of the normal operation voltage.

10. The semiconductor integrated circuit as claimed in claim 1, further comprising:
a power control part configured to turn off the first and second switch parts in non-operating timing when a non-operating time is within a predetermined threshold during the intermittent operation, and turn off the first, second and third switch parts in non-operating timing when a non-operating time exceeds the predetermined threshold.

11. A semiconductor integrated circuit that carries out intermittent operation, the semiconductor integrated circuit comprising:
a processor block;
a logical operation block other than a processor;
a first switch part configured to supply a normal operation voltage to the logical operation block other than a processor;
a second switch part configured to supply the normal operation voltage to the processor block;
a third switch part configured to supply a data holding voltage lower than the normal operation voltage to the processor block; and
a fourth switch part configured to be turned on, when the second switch part is turned off and the third switch part is turned on, and supply the data holding voltage to the processor block,
wherein the fourth switch part generates the data holding voltage by using a voltage drop,
wherein the second switch part is connected to a third power supply wire that supplies a common voltage, the third switch part is connected to a second power supply wire that supplies a voltage lower than the normal operation voltage and higher than the data holding voltage, and the fourth switch part is connected to the third power supply wire.

12. A semiconductor integrated circuit that carries out intermittent operation, the semiconductor integrated circuit comprising:
a processor block;
a logical operation block other than a processor;
a first switch part configured to supply a normal operation voltage to the logical operation block other than a processor;
a second switch part configured to supply the normal operation voltage to the processor block;
a third switch part configured to supply a data holding voltage lower than the normal operation voltage to the processor block; and
a fourth switch part configured to be turned on, when the second switch part is turned off and the third switch part is turned on, and supply the data holding voltage to the processor block,
wherein the fourth switch part generates the data holding voltage by using a voltage drop,
wherein the processor block has a logic circuit part and a memory, and the memory enters a power-saving sleep mode in response to having a sleep signal supplied thereto.

13. A semiconductor integrated circuit that carries out intermittent operation, the semiconductor integrated circuit comprising:
a processor block;
a logical operation block other than a processor;
a first switch part configured to supply a normal operation voltage to the logical operation block other than a processor;
a second switch part configured to supply the normal operation voltage to the processor block;
a third switch part configured to supply a data holding voltage lower than the normal operation voltage to the processor block; and
a fourth switch part configured to be turned on, when the second switch part is turned off and the third switch part is turned on, and supply the data holding voltage to the processor block,
wherein the fourth switch part generates the data holding voltage by using a voltage drop,
wherein the processor block has a logic circuit part and a memory, and
the logic circuit part reduces a leak current in response to having a predetermined back bias voltage applied thereto.

* * * * *